(12) United States Patent
Chowdhary et al.

(10) Patent No.: US 10,979,805 B2
(45) Date of Patent: Apr. 13, 2021

(54) MICROPHONE ARRAY AUTO-DIRECTIVE ADAPTIVE WIDEBAND BEAMFORMING USING ORIENTATION INFORMATION FROM MEMS SENSORS

(71) Applicants: STMicroelectronics, Inc., Coppell, TX (US); STMicroelectronics International N.V., Schiphol (NL)

(72) Inventors: Mahesh Chowdhary, San Jose, CA (US); Prasanth Logaraman, Tamil Nadu (IN); Arun Kumar, New Delhi (IN); Rajendar Bahl, Gurugram (IN)

(73) Assignees: STMicroelectronics, Inc., Coppell, TX (US); STMicroelectronics International N.V., Schiphol (NL)

( * ) Notice: Subject to any disclaimer, the term of this patent is extended or adjusted under 35 U.S.C. 154(b) by 155 days.

(21) Appl. No.: 16/235,947

(22) Filed: Dec. 28, 2018

(65) Prior Publication Data
US 2019/0208318 A1 Jul. 4, 2019

Related U.S. Application Data

(60) Provisional application No. 62/613,729, filed on Jan. 4, 2018.

(51) Int. Cl.
*G10L 21/0208* (2013.01)
*H04R 3/00* (2006.01)
(Continued)

(52) U.S. Cl.
CPC ............... *H04R 3/005* (2013.01); *B81B 7/00* (2013.01); *G10L 21/0208* (2013.01);
(Continued)

(58) Field of Classification Search
CPC .......... H04R 3/005; H04R 1/40; H04R 1/406; G10L 21/0232; G10L 21/0208; G10L 25/78; G10L 2021/02166; B81B 2201/02
(Continued)

(56) References Cited

U.S. PATENT DOCUMENTS

| 7,567,678 B2 * | 7/2009 | Kong | ................... G10L 21/0208 381/92 |
| 2010/0128892 A1 * | 5/2010 | Chen | ..................... H04R 3/005 381/92 |

(Continued)

OTHER PUBLICATIONS

Van Veen et al., "Beamforming: A Versatile Approach to Spatial Filtering," *IEEE ASSP Magazine*, Apr. 1988, pp. 4-24.

*Primary Examiner* — Paul Kim
*Assistant Examiner* — Ubachukwu A Odunukwe
(74) *Attorney, Agent, or Firm* — Seed IP Law Group LLP

(57) ABSTRACT

A method and apparatus for auto-directive adaptive beamforming for a microphone array using microelectromechanical systems (MEMS) sensor orientation information are provided. The microphone array captures audio and the MEMS sensor detects an orientation of the microphone array. A direction of arrival of a source signal is estimated based on the data representative of the audio. A change in an orientation of the microphone array is detected based on the orientation and the direction of arrival is compensates based on the change in the orientation of the microphone array. The apparatus pre-steers a beam of a beam pattern of the microphone array based on the compensated direction of arrival to retain the source signal in a broadside of the microphone array and performs adaptive wideband beamforming to null one or more interfering sources in the beam pattern while retaining the source signal in the broadside of the microphone array.

17 Claims, 20 Drawing Sheets

(51) Int. Cl.
  *H04R 1/40*      (2006.01)
  *H04R 3/04*      (2006.01)
  *G10L 25/78*     (2013.01)
  *G10L 21/0216*   (2013.01)
  *B81B 7/00*      (2006.01)
  *G01S 3/80*      (2006.01)

(52) U.S. Cl.
  CPC ...... *H04R 1/406* (2013.01); *B81B 2201/0235* (2013.01); *B81B 2201/0242* (2013.01); *G01S 3/80* (2013.01); *G10L 25/78* (2013.01); *G10L 2021/02166* (2013.01); *H04R 3/04* (2013.01); *H04R 2410/05* (2013.01)

(58) Field of Classification Search
  USPC .................................................. 381/92, 71.7
  See application file for complete search history.

(56) References Cited

U.S. PATENT DOCUMENTS

| | | | |
|---|---|---|---|
| 2012/0182429 A1* | 7/2012 | Forutanpour | H04R 3/005 348/175 |
| 2015/0281839 A1* | 10/2015 | Bar-On | G10L 21/0208 381/71.7 |
| 2018/0146306 A1* | 5/2018 | Benattar | H04W 4/80 |

* cited by examiner

MICROPHONE ARRAY AUTO-DIRECTIVE ADAPTIVE WIDEBAND BEAMFORMING USING ORIENTATION INFORMATION FROM MEMS SENSORS

BACKGROUND

Technical Field

The present disclosure is related to auto-directive adaptive beamforming for a microphone array using orientation information and, in particular, orientation information provided by a microelectromechanical systems (MEMS) sensor.

Description of the Related Art

Beamforming improves signal acquisition by directionally focusing a sensor array (or beam thereof) in a direction of a source signal and nulling angles at which sources of interference impinge on the array. Whereas traditional communication equipment and radar devices that use beamforming have a stationary array, modern devices, such as consumer electronic handheld devices, frequently change their position or orientation in relation to the source signal and interference. This renders beamforming sub-optimal. Re-converging the beam onto the source signal is both computationally intensive and time consuming.

BRIEF SUMMARY

In auto-directive beamforming, a microphone array determines a direction of arrival of a source signal and steers a beam of the microphone array in the direction of arrival. Steering the beam in the direction of arrival of the source signal may include maximizing a gain of a beam pattern in the direction of arrival. Further, the gain is minimized in a direction of noise or interference sources.

When a position of the microphone array changes while a position of the source signal and a position of the noise or interference remains the same, the gain of the beam pattern is no longer maximized in the direction of the source signal. That is due to the fact that the source signal has now shifted in relation to the microphone array. Beamforming may be performed again to converge on the new positions of the source and noise or interference. However, performing the beamforming again is computationally intensive (and time-consuming). The beam pattern of the microphone array may not converge in time and some audio may not be optimally captured in the interim.

Some devices, such as consumer electronics devices, include a microphone array as well as one or more sensors that provide orientation information. The one or more sensors may be microelectromechanical systems (MEMS) sensors. The one or more sensors may include an inertial sensor, a magnetic compass sensor, an accelerometer, a gyroscope or a magnetometer, among others. The one or more sensors may be embedded on the device. The orientation information may be used together with the estimated direction of arrival of the source signal to adjust the beam pattern without re-executing or re-running the beamforming. The convergence of an auto-directive adaptive beamformer is adjusted to compensate for the orientation change of the microphone array.

Auto-directive adaptive wideband beamforming may be performed for speech signals captured by mobile or wearable devices, among others. A captured signal at each microphone of the microphone array is separated into different frequency bands. A coherence test is used to determine the presence of a single source in a time-frequency bin. If a single source is present, noise floor tracking is used to select time-frequency bins having a signal power that is greater than a noise floor. It is then determined whether there is voice activity in the selected bin. If voice activity is detected, then the direction of arrival of the source signal in each time-frequency bin is estimated. Each direction of arrival is then compensated based on the orientation information to account for changes in the orientation of the microphone array. A histogram of the directions of arrival is constructed and a peak of the histogram is identified as the source direction of arrival to which the beam pattern of the array is steered.

DETAILED DESCRIPTION

Figure 1:
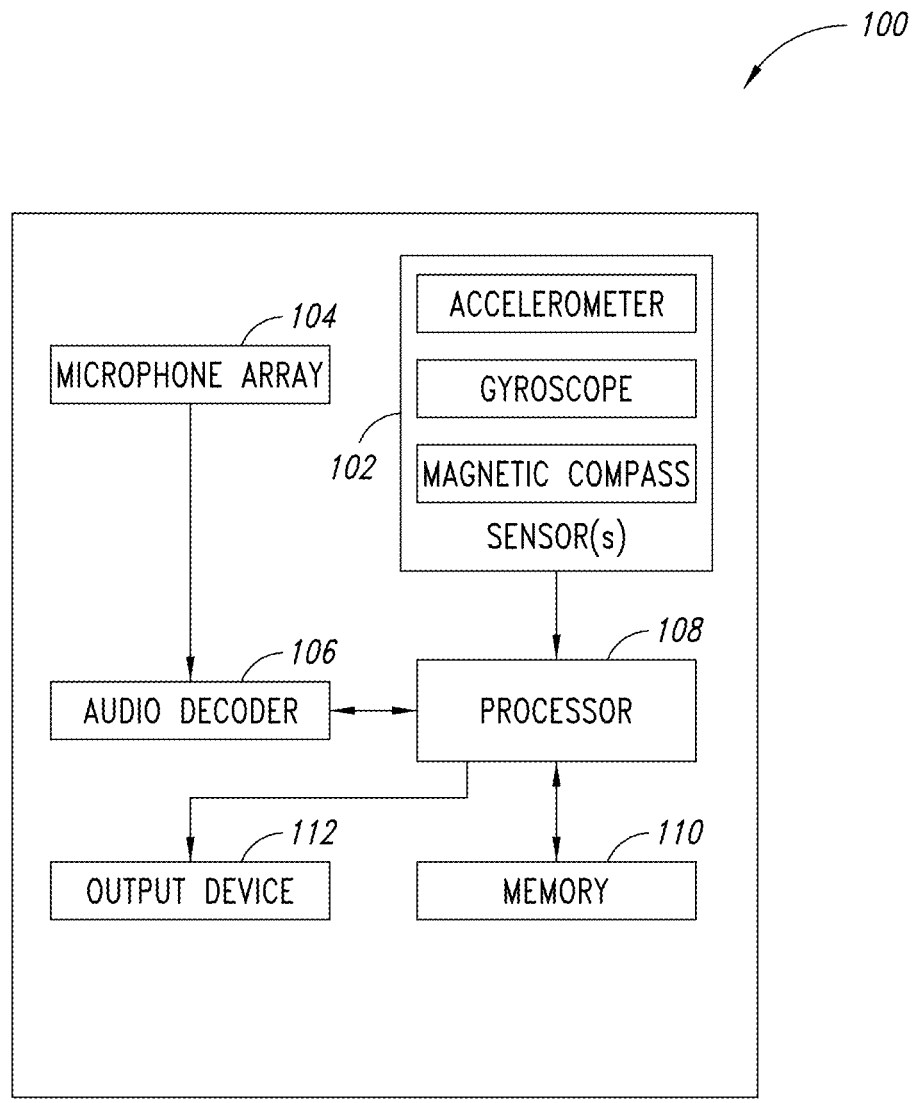
FIG. 1 shows a block diagram of an adaptive beamforming device.

An array of microphones with adaptive wideband beamforming may be used to perform spatial filtering of a desired speech signal and suppress interfering noise (for example, that impinges on the array from other directions). In adaptive beamforming, knowledge of the direction of the desired source signal allows the signal to pass through unattenuated while optimally suppressing interfering noise from other spatial directions. The desired source signal may be at any angle or direction in relation to the microphone array and the position of the desired source signal may change over time. Source tracking as described herein may be used to identify one or more acoustic sources and find a direction of the desired speech source such that a beam can be formed in the direction of the source in an auto-directive manner.

The orientation of a device, such as a consumer electronic device, may change over time, for example in a continuous or intermittent manner. The device may be a hand-held device (such as, a smartphone or tablet) or a wearable device (such as, a smartwatch an activity tracker). A change in orientation of the device may cause degradation in a quality of a source signal obtained from the microphone array using adaptive beamforming. That is due to the fact that an adaptive beamformer takes time to re-converge to a new set of weights that steer a gain of a beam (or pattern thereof) of the microphone array in a new direction of the source signal. In addition, the adaptive beamformer takes time to optimally re-position the nulls of the beam pattern in a new direction of the interfering noise.

The convergence of adaptive beamforming is improved by periodically compensating an orientation change of the device using orientation information provided by one or more orientation sensors of the device. The one or more orientation sensors may be microelectromechanical systems (MEMS) sensors. An orientation sensor may be an accelerometer, gyroscope or magnetometer, among others.

Enhancement of a source signal (such as a source speech signal) captured by a device in a directional noise environment is provided herein. The device includes a microphone array. The positions of the source signal and/or one or more interfering noise sources may change, whereby the change may be continuous or intermittent. The device performs auto-directive adaptive beamforming in which the orientation information determined by one or more sensors on board the device is used in conjunction with source signal direction of arrival estimation to track the direction of the source and noise in relation to the microphone array. By combining the orientation information and the estimated direction of arrival, the device enhances the quality of the source signal in an environment with directional noise sources.

Reading or recording of microphone array output on wearable or mobile devices may be performed in varying background noise conditions. To enhance the quality of a desired source signal, beamforming, which is a form of spatial filtering, is performed. The change in the directions of the source signal and noise and interference signal due to the continuous or intermittent orientation changes of the microphone array is counteracted by adaptively changing beamformer coefficients (or the spatial filter) based on the orientation information.

Provided herein is auto-directive adaptive wideband beamformer for a microphone array that may be included in a smart phones and a wearable device. As the orientation of the microphone array changes, the adaptive beamformer places beam pattern nulls in the directions of interfering noise sources while passing signals from a source direction substantially undistorted. Source tracking is used to determine changes in an angular position of the desired source (for example, periodically) based on orientation information of the microphone array provided by one or more sensors, which may be MEMS inertial sensors or magnetic compass sensors. The microphone array is pre-steered to render the source signal in the array broadside and multichannel data of the array is provided an adaptive wideband beamformer. As a result, convergence time of the adaptive beamformer is improved in the event that the source signal changes position and/or the microphone array device changes its orientation in relation to the source signal.

FIG. 1 shows a block diagram of an adaptive beamforming device 100. The device 100 may be a mobile or wearable device, among others. The device 100 may be a smartphone, a smartwatch, an electronics speech recognition system, a portable audio or speech signal recorder, a video or audio conferencing system, an acoustics based obstacle detector or a direction of arrival estimation device for a moving system such as a drone. The device 100 may also be a hands-free audio receiver in an automobile for cancelling directional engine noise.

The device 100 includes one or more sensors 102, a microphone array 104, an audio decoder 106, a processor 108, memory 110 and an output device 112. The processor 108 is communicatively coupled to the one or more sensors 102, audio decoder 106, memory 110 and output device 112. The audio decoder 106 is communicatively coupled to the microphone array 104.

The processor 108 may be any type of device configured to execute executable instructions stored in the memory 110. When the executable instructions are executed by the processor 108, the executable instructions cause the processor 108 to perform the functions or techniques described herein. The processor 108 may be a controller, a microcontroller or a microprocessor, among others, and may include an arithmetic and logic unit (ALU), among other computational units. The processor 108 may perform the techniques described herein. For example, the processor 108 may receive data representative of audio and data representative of orientation, estimate a direction of arrival of a source signal, detect a change in an orientation of the microphone array 104, compensate the direction of arrival based on the change in the orientation, pre-steer a beam of a beam pattern of the microphone array 108 based on the compensated direction of arrival, and perform adaptive wideband beamforming to null one or more interfering sources in the beam pattern while retaining the source signal in the broadside of the microphone array 108.

The memory 110 may be any non-transitory computer-readable storage medium. The memory 110 may be configured to store executable instructions that, when executed by the processor 108, cause the processor 108 to perform the operations, methods or techniques described herein. The executable instructions may be a computer program or code. The memory 110 may include a random access memory (RAM) and/or a read-only memory (ROM). The memory 110 may store executable instructions that cause the processor to perform direction of arrival (DoA) estimation for a source signal, determine an orientation of the microphone array 104, compensate the direction of arrival based on the orientation of the microphone array 104 and perform beamforming.

The output device 112 may be any type of device configured to output data to a user. For example, the output device 111 may be a display or a speaker, among others. The output device 112 may output, to a user, an audio representation of the source signal or a direction of arrival of the source signal, among other information.

The one or more sensors 102 may be microelectromechanical systems (MEMS) orientation sensors. The one or more sensors 102 may include an accelerometer, gyroscope or magnetic compass, among others. Although multiple sensors are shown in FIG. 1, it is noted that the adaptive beamforming device 100 may include one or multiple orientation sensors. The one or more sensors 102 may determine an orientation of the microphone array 104 and output data representative of the orientation to the processor 108. The one or more sensors 102 may determine an orientation of the microphone array 104 in a three-dimensional (3D) space or a two-dimensional (2D) plane. The orientation may be may a point in the Cartesian coordinate system (for example, x,y,z) to which a beam of the array (such as a broadside beam) points. The orientation may be determined by the one or more sensors 102 assuming the microphone array 104 is centered at the origin of the Cartesian coordinate system. Although not shown, the device 100 may also include a proximity sensor positioned proximate to the microphone array 104. The proximity sensor may determine a proximity or distance between the microphone array 104 and another object, such as an ear of a user. The proximity sensor may determine a proximity or distance between the microphone array 104 and another object and output data representative of the proximity or distance. The data may be used to determine whether the user is speaking into the microphone array 104 with the device 100 close to the user's ear.

The microphone array 104 may include a plurality of microphones spaced apart from each other with an inter-microphone spacing therebetween. The microphone array 104 may have any geometry, such as linear, planar or cubic, among others. The plurality of microphones of the microphone array 104 may have equidistant or non-equidistant spacing.

The microphone array 104 may directionally capture audio in its proximity or surroundings and output one or more signals representative of the audio to the audio decoder 106. The one or more signals may be multichannel audio signals. The audio may include a source signal and/or one or more interfering signals. The one or more interfering signals may be noise or any other undesirable audio. The one or more signals may be analog signals.

The audio decoder 106 may be any type of audio decoding device, such as a Pulse Density Modulation (PDM) decoder. The audio decoder 106 may receive one or more signals (e.g., multichannel signal) from the microphone array 104. The audio decoder 106 may process the one or more signals by applying anti-aliasing filtering and performing analog-to-digital conversion (ADC) on the filtered one or more signals. The audio decoder 106 may generate data representative of the one or more signals, whereby the data may be digital data. The decoder 106 outputs the data to the processor 106. It is noted that a PDM may be used when the microphone array 104 is a digital microphone array.

Figure 2:
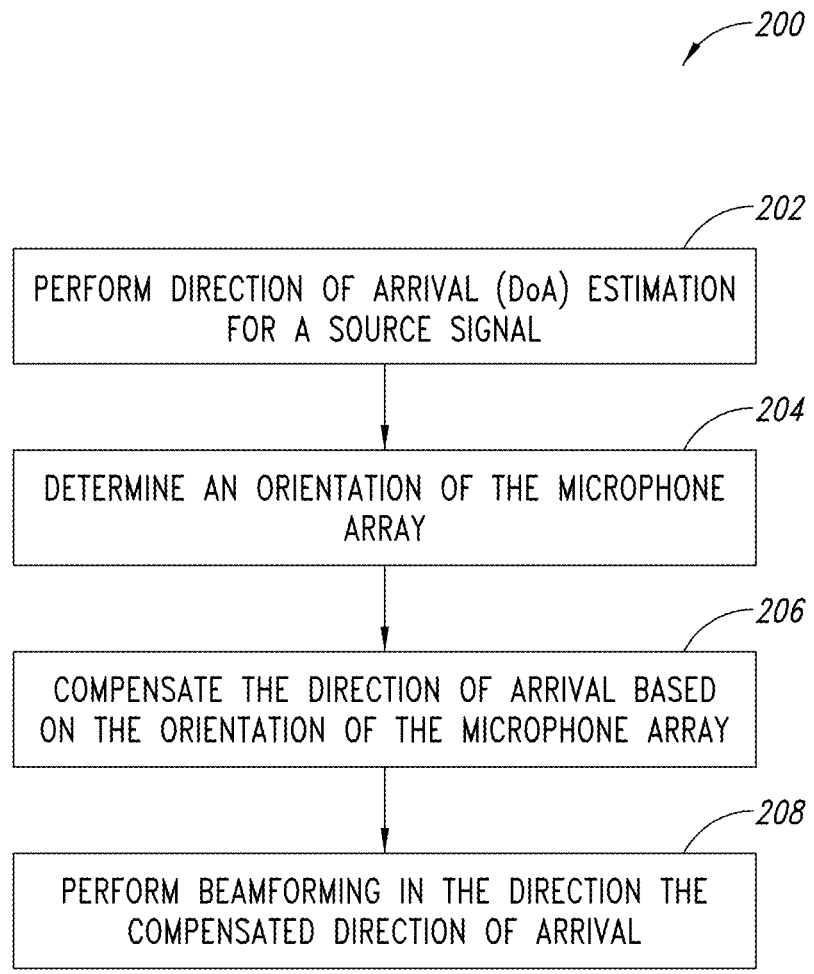
FIG. 2 shows a flow diagram of a method for performing adaptive wideband beamforming.

FIG. 2 shows a flow diagram of a method 200 for performing adaptive wideband beamforming. In the method 200, a processor, such as the processor 108 described with reference to FIG. 1, performs direction of arrival (DoA) estimation for a source signal at 202. The processor performs the direction of arrival estimation based on the data representative of a multichannel signal received from the audio decoder 106. The processor may determine the direction of arrival of the source signal periodically (for example, every second, two seconds, etc). Adaptive beamforming optimally nulls directions of interfering noise sources while maximizing a gain in direction of arrival of the source signal. Thereby, the source signal passes through substantially undistorted.

The processor determines an orientation of the microphone array at 204. The processor may determine the orientation of the microphone array 104 based on the data representative of the orientation received from the one or more sensors 102. The processor may determine an instantaneous orientation in relation to time based on data receives from a MEMS inertial sensor or magnetic compass included in or embedded on the device 100. The processor periodically determines a relative orientation of the device 100 (or microphone array 104 thereof) with respect to the source signal.

The processor, at 206, compensates the direction of arrival based on the orientation of the microphone array. The processor may compensate the direction of arrival based on a change in the orientation the microphone array 104 with respect to the direction of the desired source. Therefore, as the position of the array 104 shifts or changes, the direction of arrival is adjusted to account for the change in the array's position. The processor may perform the compensation at periodic intervals. The processor, at 208, performs beamforming in the direction of the compensated direction of arrival, whereby the processor processes multichannel data of the microphone array 104 based on the orientation data received from the one or more sensors 102. The processor 108 performs auto-directive adaptive wideband beamforming using the orientation information received from the one or more sensors 102. The processor 108 may also output to the output device data indicative of a direction of the source signal. Performing the adaptive beamforming enhances the source signal while minimizing the contribution of noise sources.

Figure 3A:
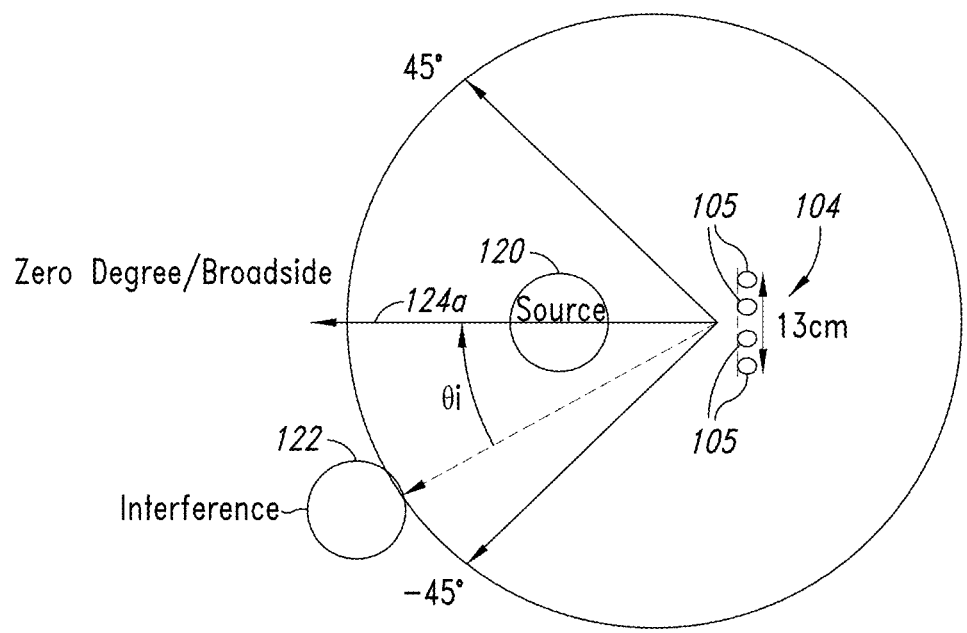
FIGS. 3A and 3B show the microphone array positioned in relation to a source signal and an interference in a two-dimensional plane.
Figure 3B:
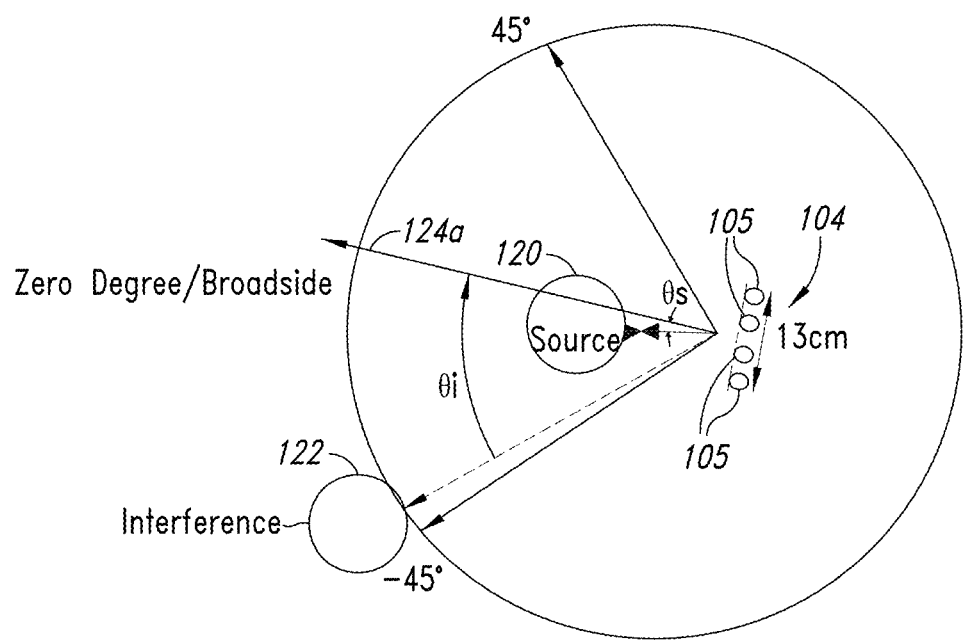

FIGS. 3A and 3B show the microphone array 104 positioned in relation to a source signal 120 and an interference 122 in a two-dimensional plane. The source signal 120 and the interference 122 (or noise source) are at fixed positions. The microphone array 104 is shown as a uniform linear array with four microphones 105 and an inter-element spacing of 4.33 centimeters (cm) resulting in an aperture length of the microphone array 104 of 13 cm. The inter-element spacing advantageously avoids spatial aliasing of telephone band speech in the azimuthal two-dimensional plane.

The microphone array 104 is in a first position in FIG. 3A in which the source signal 120 has an azimuth angle ($\theta_s$) that coincides with the broadside 124a of the microphone array 104 (or $\theta_s=0°$). The interference 122 has an azimuth angle ($\theta_i$) in relation to the broadside 124a of the microphone array 104. When the microphone array 104 is rotated clockwise to the second position in FIG. 3B, the broadside 124b of the array 104 also rotates. The rotation of the microphone array 104 may be due to the movement of the device 100. The azimuth angle of the source signal ($\theta_s$) and the azimuth angle of the interference 122 ($\theta_i$) increase.

The change in the azimuth angle of the source signal ($\theta_s$) and the azimuth angle of the interference 122 ($\theta_i$) is equal to the change in the azimuth angle of the broadside 124 of the array 124. Due to the change, the converged weight vector of a beamformer determined by the processor 108 becomes sub-optimal as the gain of the beam pattern is no longer maximized in a direction of the source signal 120 and the beam pattern nulls do not point in the direction of the interference 122. Accordingly, the processor 108 adapts the beam pattern to the new spatial scenario of FIG. 3B to keep the weight vector of the beamformer optimal.

In practice, the orientation of the device 100 (and the array 104 thereof) changes (e.g., continuously or intermittently) as the device 100 is operated or used. Thus, the performance of the adaptive beamformer established by the device 100 to maximize the gain in a direction of the source 120 and create a null in a direction of the interference 122 may degrade drastically due to the fact that the optimal re-convergence of a beamforming weight vector to a new scenario takes time.

To compensate for orientation changes of the device 100, the one or more sensors 102 and/or proximity sensor are used to obtain orientation information of the device 100. The relative orientation of the microphone array 104 with respect to the source direction is determined (for example, periodically) and then compensated (based on position information) to refocus a look direction of the beam in a new source direction.

Compensation of the orientation change may be performed in a pre-processing step of the beamformer. Compensation of the orientation change extends the viability of the optimal weights. Due to the fact that performing beamforming is time consuming, compensating the weights of the beamformer based on the orientation information avoids the delay of re-convergence of the adaptive beamforming algorithm due to the orientation change of the device 100 (and array 104 thereof).

The processor 108 performs direction of arrival estimation of the source signal for source tracking based on multichannel data of the microphone array 104. To determine the direction of arrival, the processor 108 evaluates the data on a frame-by-frame basis, where each frame may, for example, be 20 milliseconds (ms). Due to the short duration of the frame, it is possible that some frames have background or interfering noise without the source signal and the source signal may not be available in all frames. The absence of the source signal may prevent determining the direction of arrival in every frame. As described herein, a histogram of the directions of arrival determined over a respective plurality of frames is developed. The histogram is then used to determine the source signal direction of arrival based on a statistical metric, such as the histogram mean, median or mode, among others.

Figure 4:
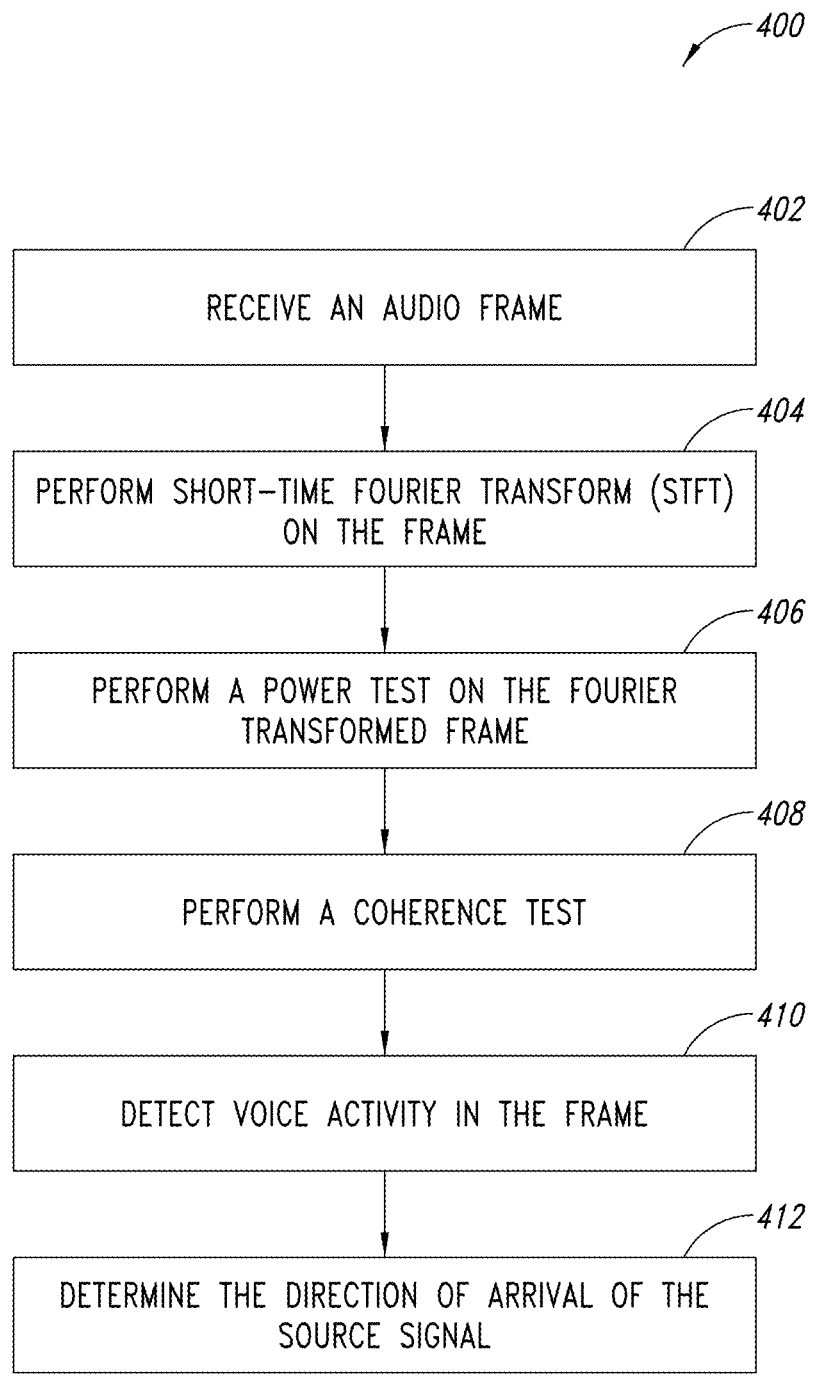
FIG. 4 shows a flow diagram of a method for performing frame-by-frame direction of arrival estimation.

FIG. 4 shows a method 400 for performing frame-by-frame direction of arrival estimation. A processor, such as the processor 108 described with reference to FIG. 1, receives an audio frame at 402. The processor, at 404, performs a short-time Fourier transform (STFT) on the frame. The processor, at 406, performs a power test on the Fourier transformed frame. The power test includes determining whether the frame has a signal power above a noise threshold. The noise threshold may be determined dynamically based on real time data.

If the power test yields a determination that the signal power is lower than the noise threshold (e.g., the source signal is absent), the processing of the frame may end and a subsequent frame may be evaluated at 402. If the signal power is comparable to the noise threshold or is more than the noise threshold, the method 400 proceeds to performing a coherence test at 408.

The coherence test may be performed to identify frames dominated by a single source. The coherence test may be a magnitude-squared coherence (MSC) test and may be used to determine whether an auto correlation matrix of the frame has rank of one or a rank that is different than one.

For a given frame, time-frequency bins having a number of active sources (including the signal source and the interference) that is greater than or equal to the number of sensors in the microphone array have an effective auto correlation matrix with a full rank. The time-frequency bins of frames with fewer active sources than the number of sensors in the microphone array 104 have a lower effective rank for the auto-correlation matrix and may be poorly conditioned. Thus, to obtain an accurate direction of arrival estimate, a single source is desirable in each frame to yield rank one auto correlation matrix. If the rank of the auto correlation matrix is one, the method proceeds to step 410. However, if the rank of the auto correlation matrix is different than one, the method may end and subsequent frame may be evaluated at 402.

At 410, the processor detects voice activity in the frame. Detecting the voice activity includes determining whether speech is present in the frame. If speech is not present in the frame, the process may end and revert to step 402 where a subsequent audio frame is evaluated. Conversely, if the speech signal is present in the frame, the method 400 proceeds to step 412. At 412, the processor estimates the direction of arrival of the source signal.

As described herein, direction of arrival estimation of the source signal in the frame is performed if the frame is deemed to pass the power test at 406, the coherence test at 408 and the voice activity detection at 410.

Figure 5:
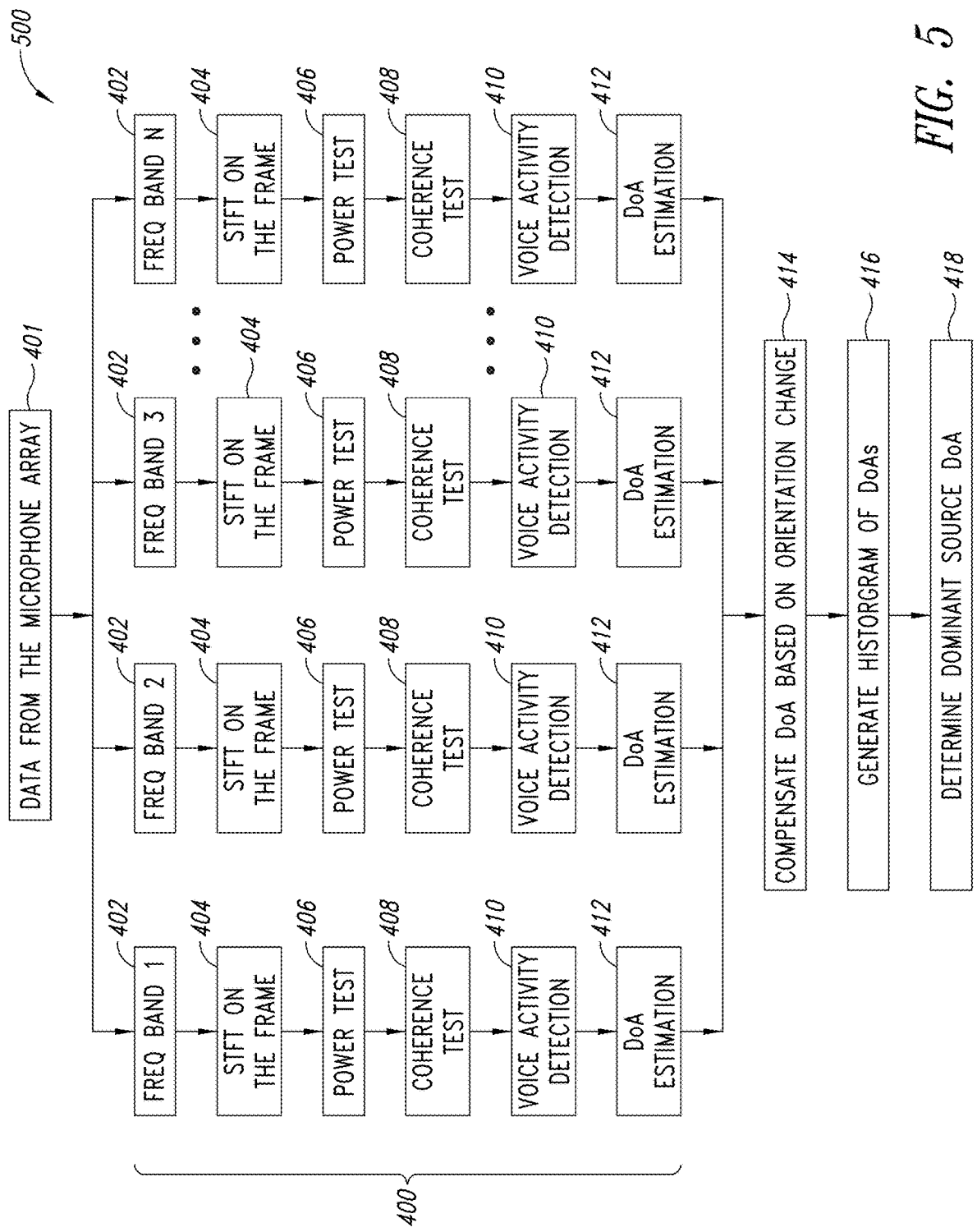
FIG. 5 shows a flow diagram of a method for estimating the direction of arrival of a dominant speech source.

FIG. 5 shows a method 500 for estimating the direction of arrival of a dominant speech source. The method 500 may be used to form a beam in a direction of a desired speech source. Speech signals may be sparse in time and frequency compared to interference sources.

In the method 500, a processor, such as the processor 108 described with reference to FIG. 1, receives data from a microphone array at 401. Frames of each sensor of the microphone array may be split or divided into a number of different frequency bands (N). Frames of each sensor of the microphone array may be divided temporally into frames. The frames of each frequency band are evaluated per the method 400 described with reference to FIG. 4. For each frequency band, the processor performs short-time Fourier transform (STFT) on the frame at 404 and performs a power test on the Fourier transformed frame at 406. Further, the processor performs a coherence test at 408 and detects voice activity at 410. As described herein, if the frame of a frequency band is deemed to pass the power test at 406, the coherence test at 408 and the voice activity detection at 410, the processor estimates the direction of arrival of the speech source at 412.

The processor, at 414, compensates each determined direction of arrival based on an orientation change provided by the one or more sensors 102. The instantaneous orientation information provided by the one or more sensors 102 is used to adjust the determined direction of arrival thereby adjusting the direction of arrival based on instantaneous movement of the microphone array 104.

The processor, at 416, generates a histogram of the compensated directions of arrival across several frames and/or frequency bands. It is noted that separating an audio signal of a frame into multiple time-frequency bins is advantageous in determining the direction of arrival of a dominant source. The processor, at 416, determines the dominant source direction of arrival from the histogram. For example, the dominant source direction of arrival may be a mean, median or mode of the histogram. The dominant source direction of arrival (being compensation for the orientation change) is used to pre-steer a beam of the microphone array 104 to keep a broadside of the formed beam of the array 104 in a direction of the dominant source.

Figure 6:
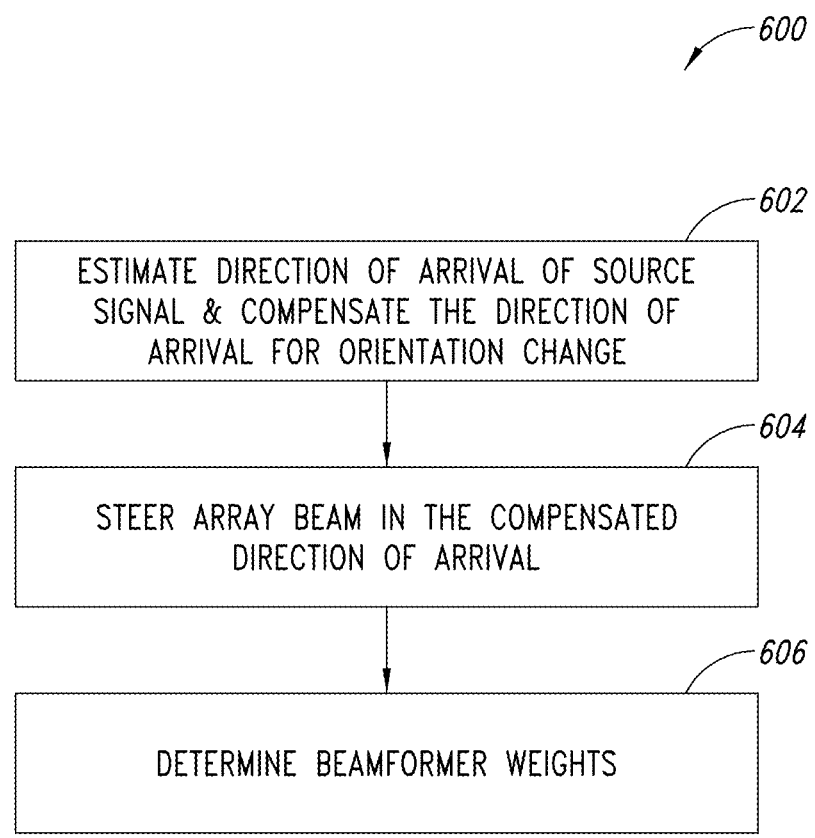
FIG. 6 shows a flow diagram of a method of performing auto-directive adaptive wideband beamforming.

FIG. 6 shows a flow diagram of a method 600 of performing auto-directive adaptive wideband beamforming. In the method 500, a processor, such as the processor 108 described with reference to FIG. 1, estimates the direction of arrival of a source signal and compensates the direction of arrival for an orientation change at 602. Estimating and compensating the direction of arrival may be performed as described with reference to FIG. 5. At 604, the processor pre-steers a microphone array beam in the compensated direction of arrival. At 606, the processor determines weights of the beamformer for the microphone array. The beamformer receives the source signal from a broadside of the array and adaptively suppress the interference noise sources arriving from other directions.

Figure 7:
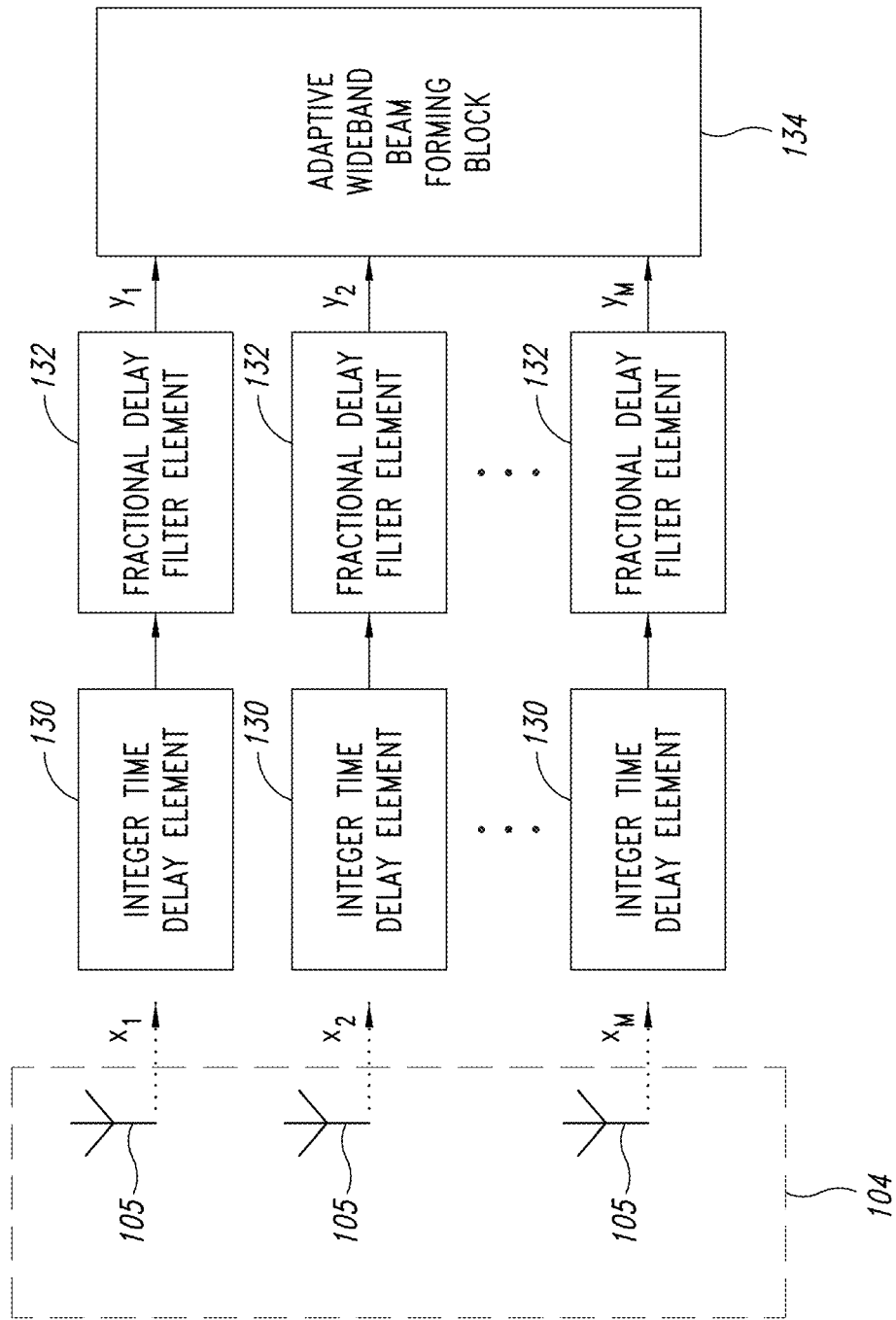
FIG. 7 shows a block diagram of processing stages of steering a look direction of a beamformer.

FIG. 7 shows a block diagram of processing stages of steering a look direction of a beamformer. An output of each microphone 105 of the microphone array 104 is coupled to an input of an integer time delay element 130. An output of the integer time delay element 130 is coupled to an input of a fractional delay filter 132. An output of the fractional delay filter 132 is coupled to an input of an adaptive wideband beamforming block 134. Each microphone 105 outputs an audio signal ($x_1, x_2, \ldots, x_M$) to a respective integer time delay element 130.

Steering the beam optimally to the direction of the source is achieved in two processing steps; a first performed by the integer time delay element 130 and a second performed by the fractional delay filter 132. Steering delays are in general fractional. Steering delays are divided or split into an integer part performed by the integer time delay element 130 and a fractional part performed by the fractional delay filter 132. A steering delay may be represented as $\Delta k$ having an integer part of $\lfloor \Delta k \rfloor$ and a proper fractional part of $\delta k = \Delta k - \lfloor \Delta k \rfloor$, where $\lfloor \Delta k \rfloor$ is a floor operation on $\Delta k$.

The integer time delay element 130 may be a delay line that implements integer delay. The fractional delay filter 132 may be a farrow structured variable fractional delay filter that implements a fractional delay. The integer time delay element 130 and the fractional delay filter 132 compensate a relative propagation delay of the source signal's wavefront between the microphones 105 such that the multichannel signal ($y_1, y_2, \ldots, y_M$) at the output of the fractional delay filter 132 is steered to the direction of the source signal. The integer time delay element 130 and the fractional delay filter 132 constitute pre-steering of the array beam and place the source signal on the broadside of the array 104.

After the pre-steering, the multichannel signal ($y_1, y_2, \ldots, y_M$) is input to the adaptive wideband beamforming block 134. The adaptive wideband beamforming block 134 places nulls optimally in directions other than the source signal direction. The adaptive wideband beamforming block 134 places the nulls subject to a constraint that the source signal in the broadside is passed undistorted.

Figure 8A:
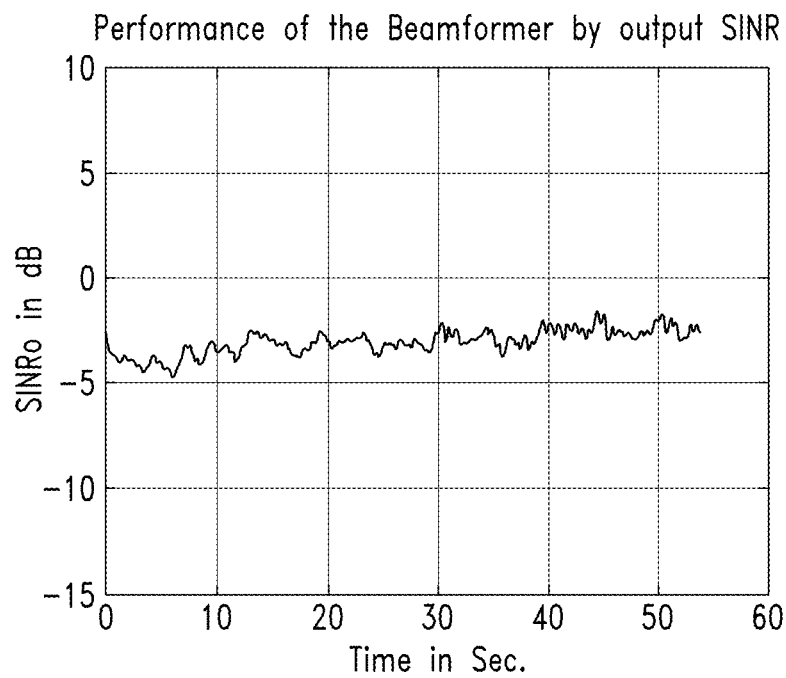
FIG. 8A shows a performance evaluation of the auto-directive adaptive wide band beamformer without orientation information.
Figure 8B:
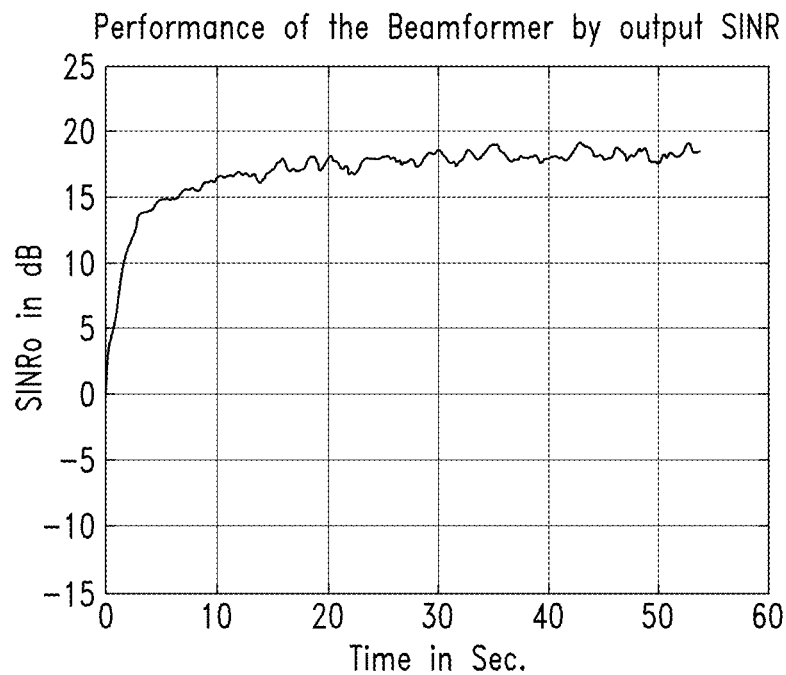
FIG. 8B shows a performance evaluation of the auto-directive adaptive wide band beamformer with orientation information.

FIG. 8A shows a performance evaluation of the auto-directive adaptive wide band beamformer without orientation information. FIG. 8B shows a performance evaluation of the auto-directive adaptive wide band beamformer utilizing orientation information. In FIG. 8B, the orientation information may be obtained from a sensor 102, such as a MEMS inertial or magnetic compass sensor. In FIGS. 8A and 8B, the signal-to-interference and noise ratio (SINR) is shown in relation to time. Convergence time may be determined as a mean square error (MSE) of a weight vector computed with respect to a final converged weight vector.

FIGS. 8A and 8B show an SINR of the beamformer for a device 100 having a 40 degrees orientation (azimuth angle) with a source signal at 0 degrees and an interference source at 20 degrees. The source signal is speech, whereas interference is bandlimited noise. The beamformer operates with the assumption that the source signal's direction is towards the broadside of the array 105, and optimally places nulls in all other directions, which are assumed to be interfering sources.

Due to the 40-degree orientation of the device 100, the beamformer distorts the source signal when the orientation information is not available to the beamformer and its performance has a low SINR of about −2 to −4 dB (as shown in FIG. 8A). However, when the information is available to the beamformer, the beamformer converges on the source signal and the output SINR becomes 18 dB.

FIGS. 9A-9E show a performance evaluation of the auto-directive adaptive wideband beamformer with and without orientation information. The performance evaluation is for an array 104 having four microphones with an inter-element spacing of 4.33 cm. The source is initially at the broadside of the beamformer and an interference noise source is at 20 degrees.

Figure 9A:
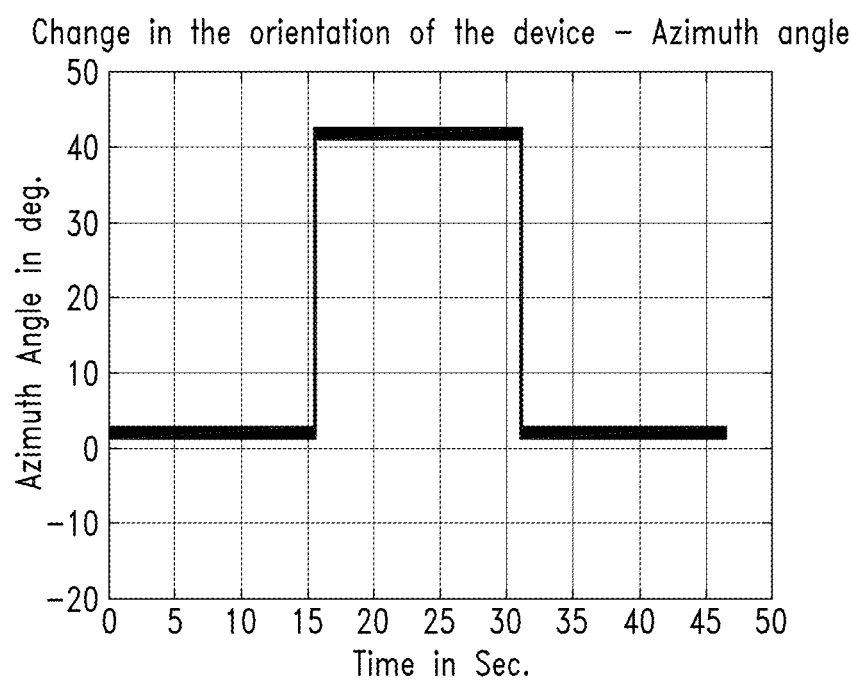
FIGS. 9A-9E show a performance evaluation of the auto-directive adaptive wideband beamformer with and without orientation information.

As shown in FIG. 9A, an orientation of the array 104 changes (at t=15.5 seconds) with respect to the source signal from 0 degrees to 40 degrees. At this point, the source is not at the broadside (0 degrees) of the array 104. At 31.66 seconds, the orientation of the array 104 reverts back to 0 degrees.

Figure 9B:
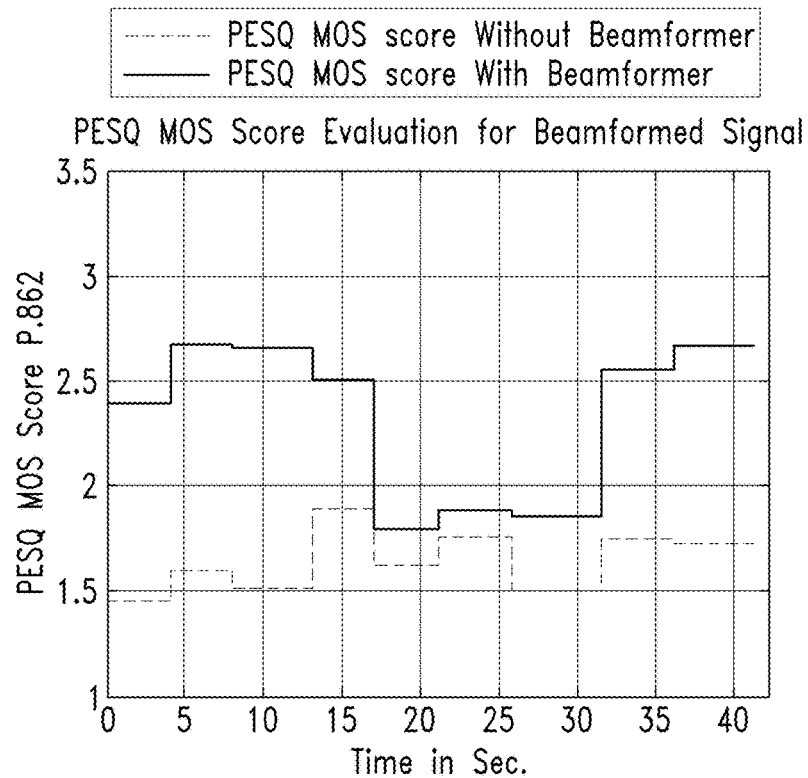
Figure 9C:
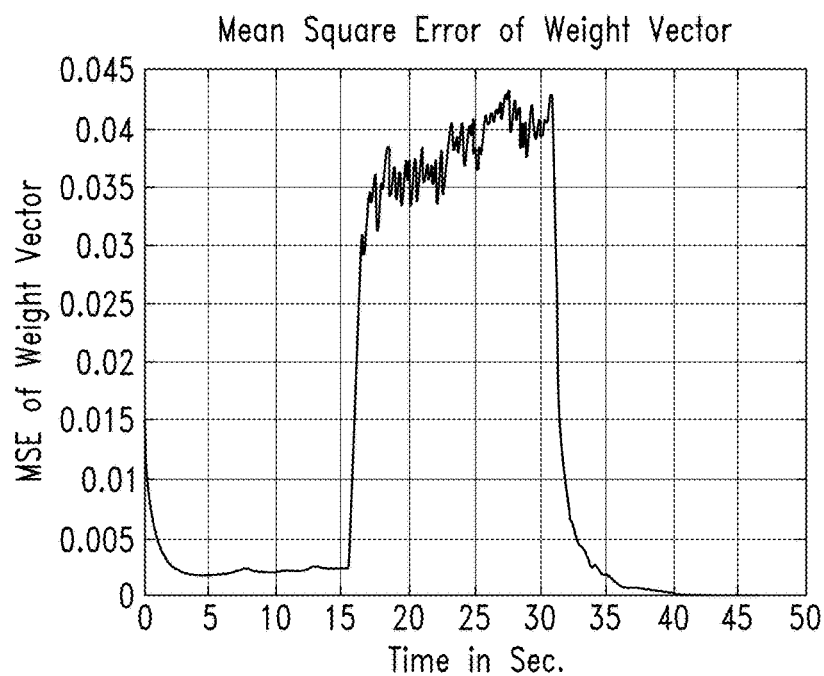
Figure 9D:
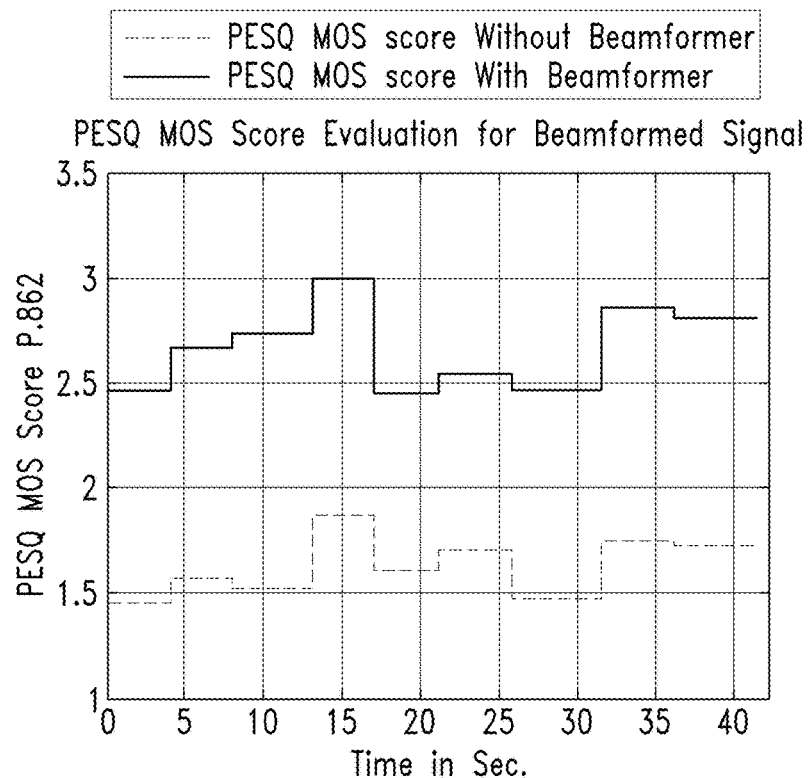
Figure 9E:
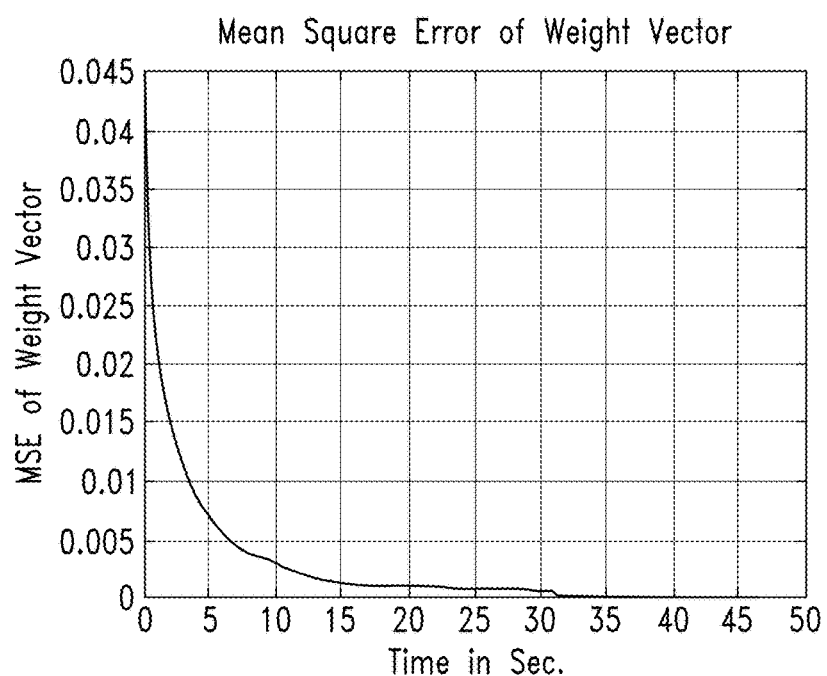

As shown in FIGS. 9C and 9E, the adaptive beamformer initially converges to the optimal weights and the MSE of the weigh vector initially incrementally decreases. When the orientation of the array changes, the source is no longer aligned with the microphone array 104. Thus, the performance of the auto-directive adaptive wideband beamformer without orientation information degrades as shown in FIG. 9C. The MSE of the weight vector computed with respect to the final converged weight vector increases. Conversely, MSE of the weight vector shown in FIG. 9E for the auto-directive adaptive wideband beamformer with orientation information does not degrade and instead continues to decrease. The weight vector converges to the final converged weight vector. That is due to the fact that the orientation information provided by the one or more sensors 102 is used to directionally-compensate the weight vector. Consequently, the source signal remains in the broadside of the array.

The Perceptual Evaluation of Speech Quality (PESQ) mean opinion scores (MOS) per ITU-T Recommendation P.862 are shown in FIGS. 9D and 9B for the auto-directive adaptive wideband beamformer with and without orientation information, respectively. The auto-directive adaptive wideband beamformer having orientation information has a higher PESQ MOS than the beamformer without orientation information.

Figure 10A:
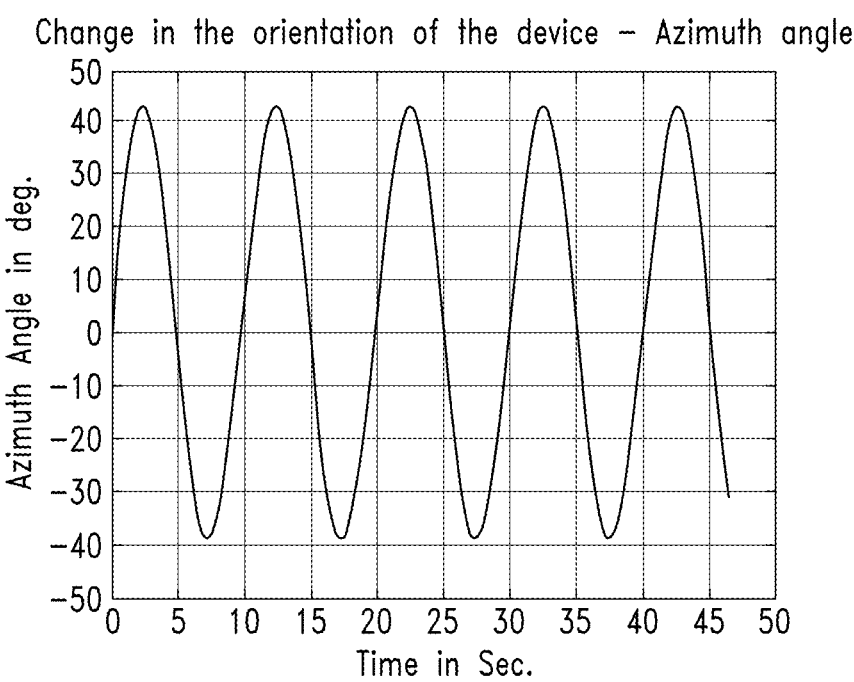
FIGS. 10A-10E show a performance evaluation of the auto-directive adaptive wideband beamformer with and without orientation information.
Figure 10B:
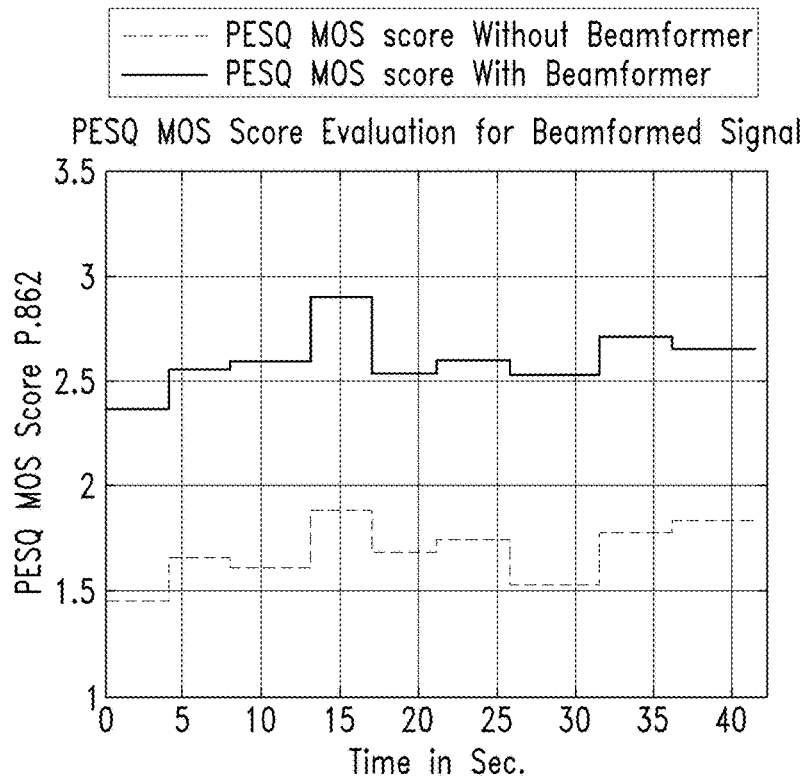
Figure 10C:
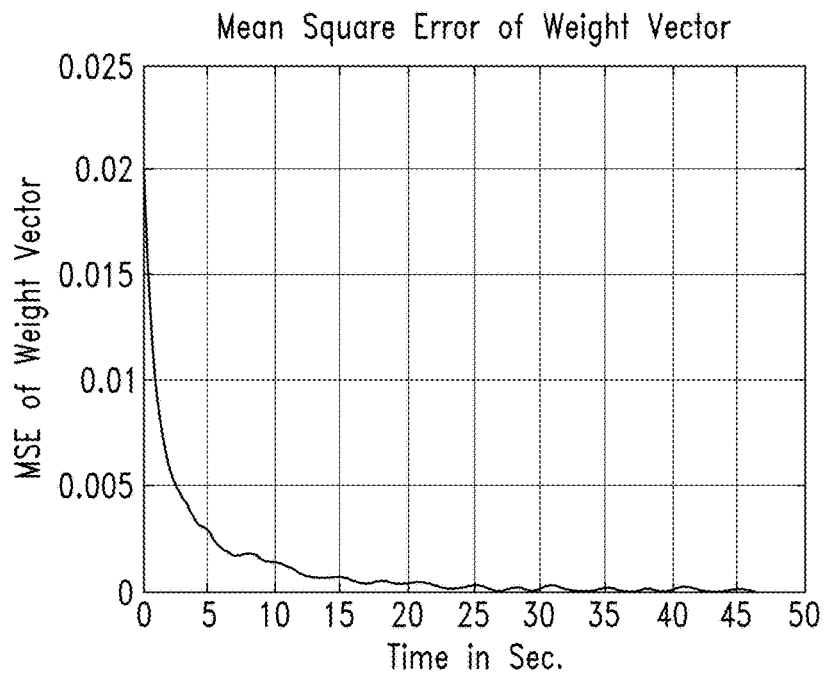
Figure 10D:
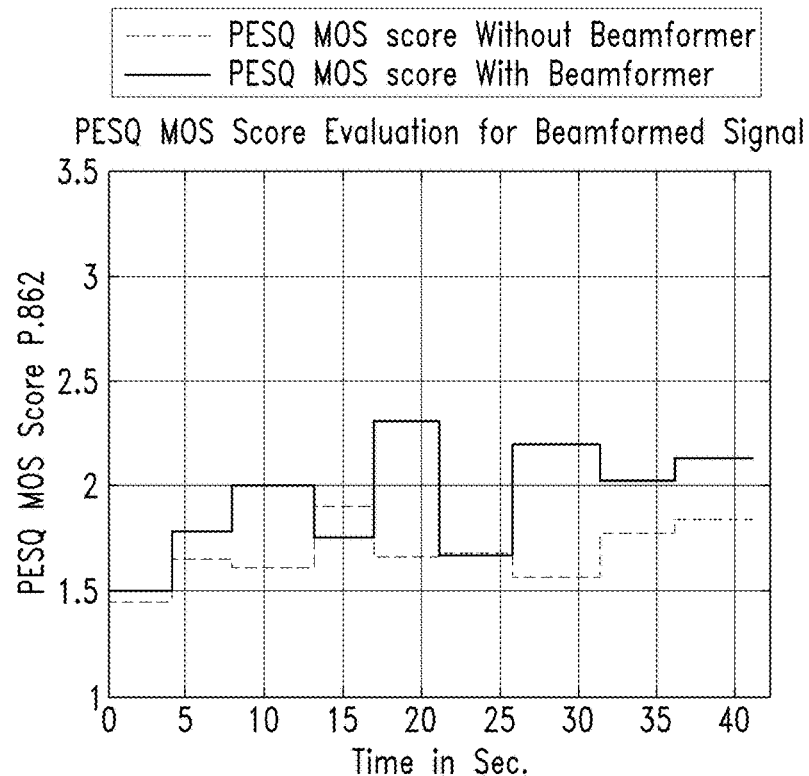
Figure 10E:
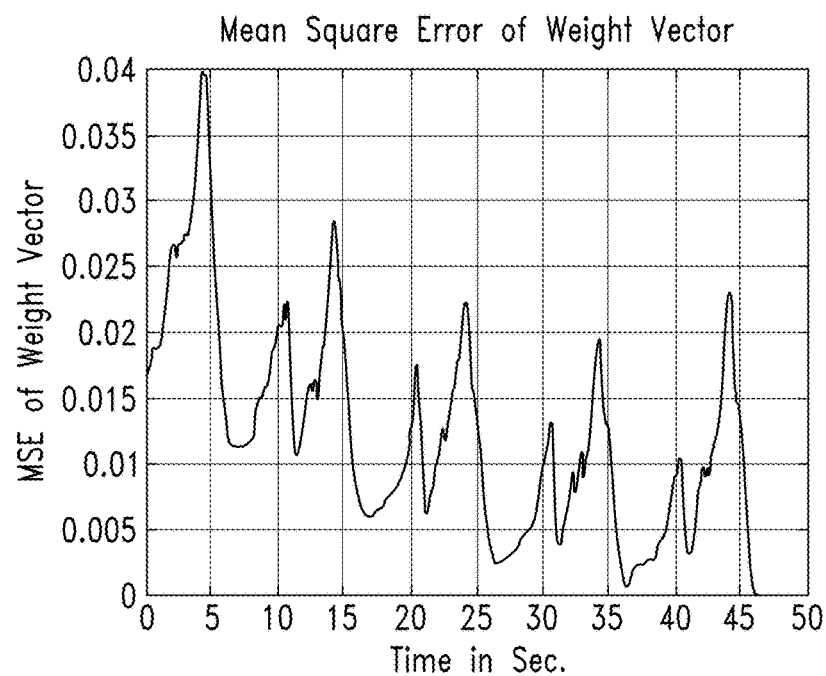

FIG. 10A-10E show performance evaluation of the auto-directive adaptive wideband beamformer with and without orientation information. As shown in FIG. 10A, an orientation of the array 104 changes in a sinusoidal manner between −40 degrees and 40 degrees. FIG. 10C shows that the adaptive beamformer with orientation information converges to the optimal weights and the MSE of the weigh vector decreases over time. Conversely, the adaptive beamformer without orientation information (As shown in FIG. 10E) does not converge to the optimal weights and the MSE of the weigh vector continues to fluctuate over time as the orientation of the array fluctuates.

The PESQ MOS are shown in FIGS. 10D and 10B for the auto-directive adaptive wideband beamformer with and without orientation information, respectively. The auto-directive adaptive wideband beamformer having orientation information has a higher PESQ MOS than the beamformer without orientation information.

Figure 11A:
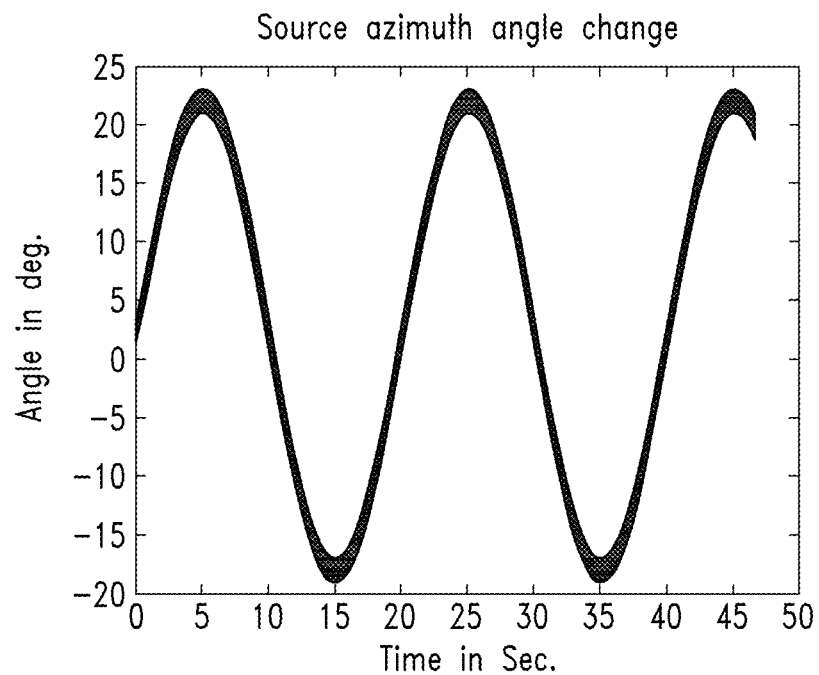
FIGS. 11A-11D show a performance evaluation of the auto-directive adaptive wideband beamformer with orientation information.
Figure 11B:
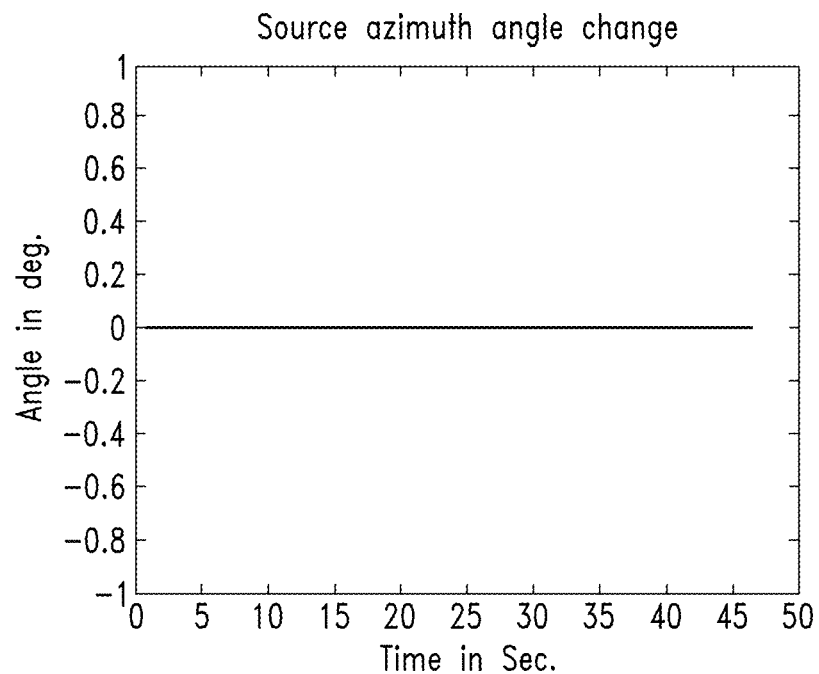

FIGS. 11A-11D show performance evaluation of the auto-directive adaptive wideband beamformer with orientation information. As shown in FIG. 11A, an azimuth angle of the signal source changes in a sinusoidal manner over time with respect to the microphone array 104 broadside. The orientation of the device 100 remains constant as shown in FIG. 11B. Simultaneously, a white noise interference signal with an SINR of 20 dB is at 60 degrees in relation to the array 104 broadside.

Figure 11C:
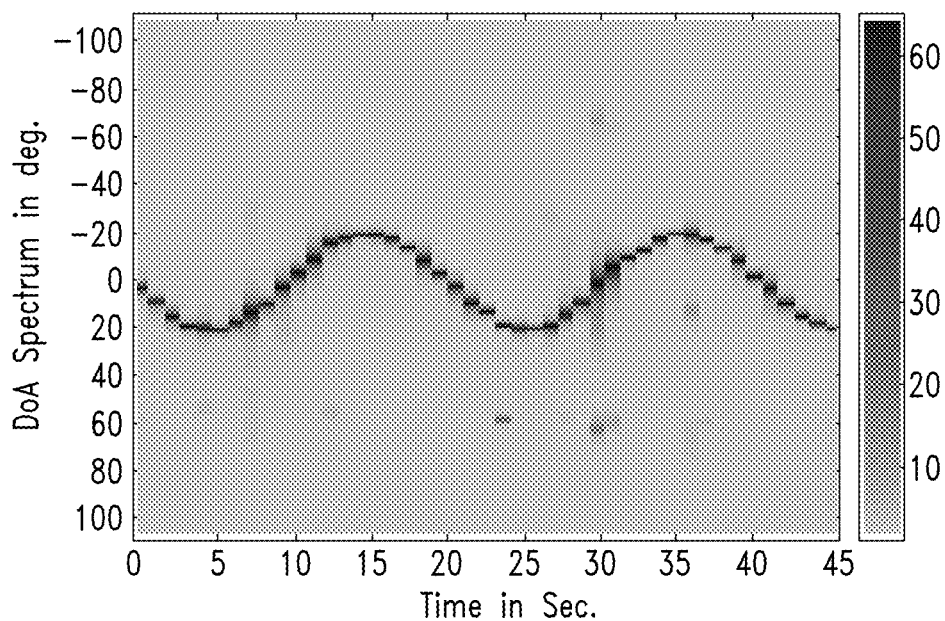
Figure 11D:
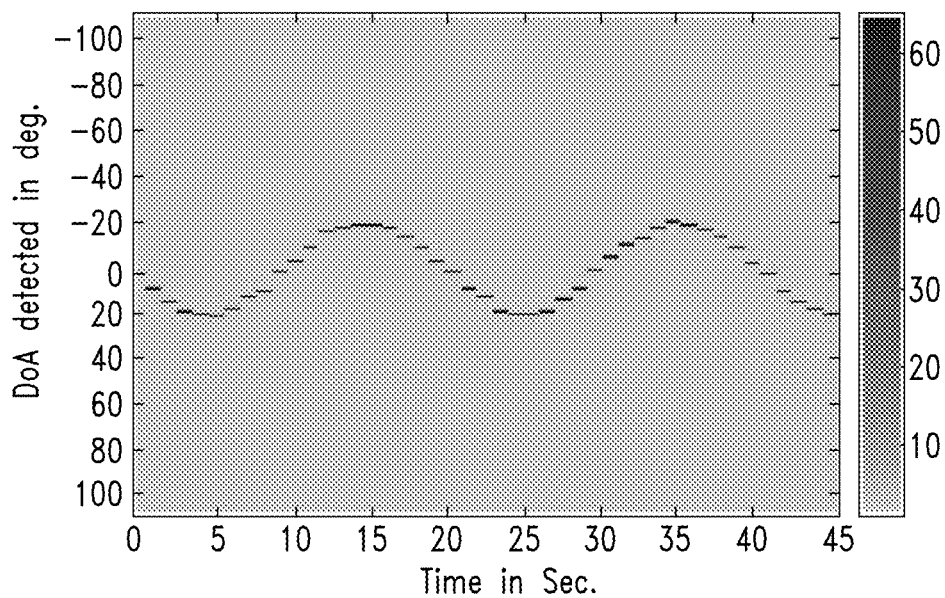

As shown in FIG. 11C, the auto-directive adaptive wideband beamformer with orientation information continuously tracks the source signal's direction of arrival and is able to resolve the direction of arrival. During post-processing, the source direction of arrival is used to pre-steer the beam such that the source appears in the broadside of the beamformer as shown in FIG. 11D.

Figure 12A:
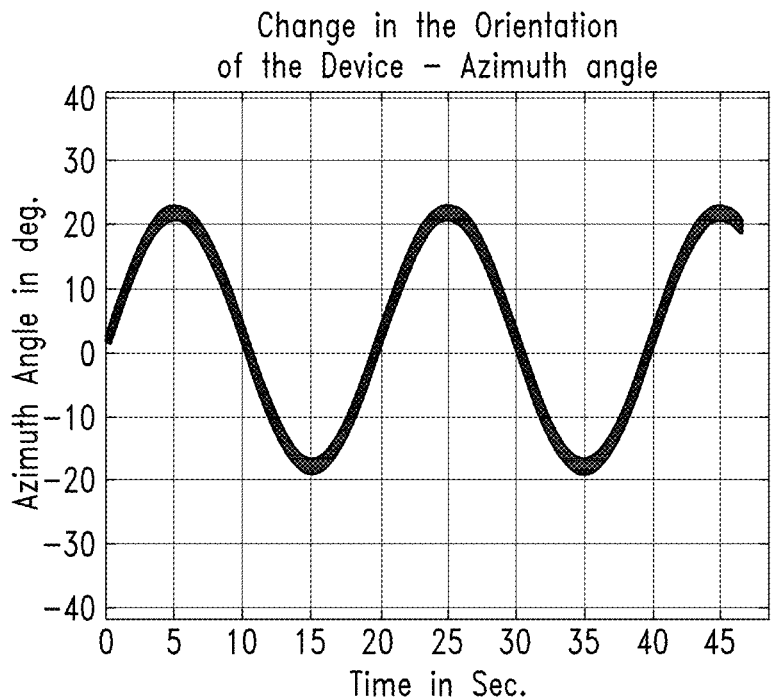
FIGS. 12A-12D show a performance evaluation of the auto-directive adaptive wideband beamformer with and without orientation information.
Figure 12B:
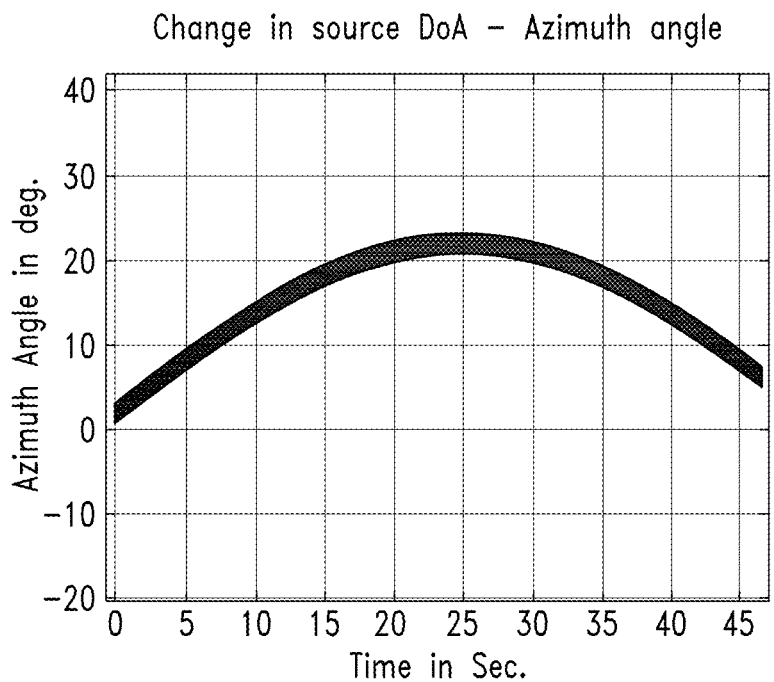
Figure 12C:
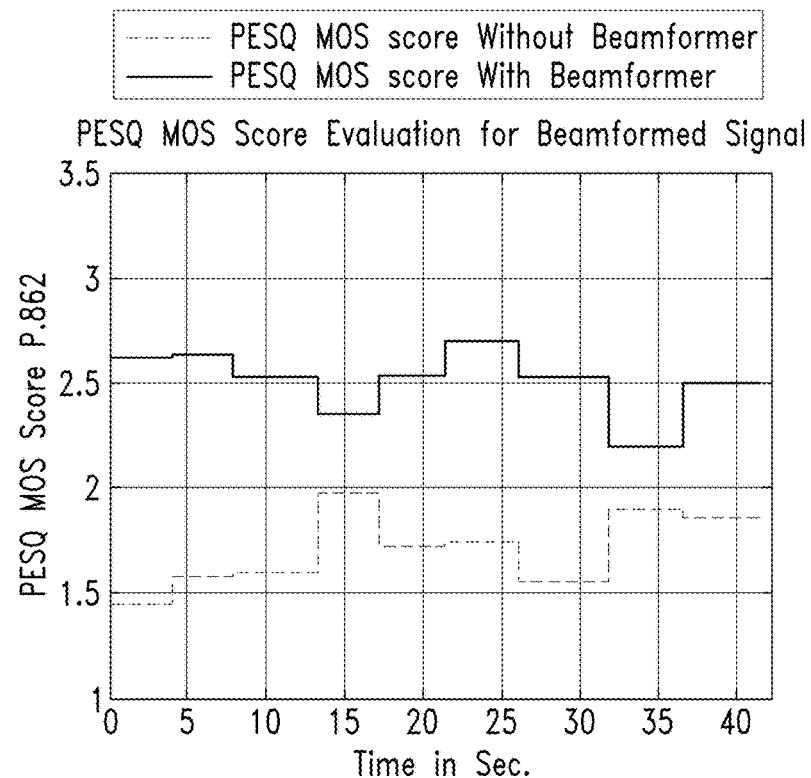
Figure 12D:
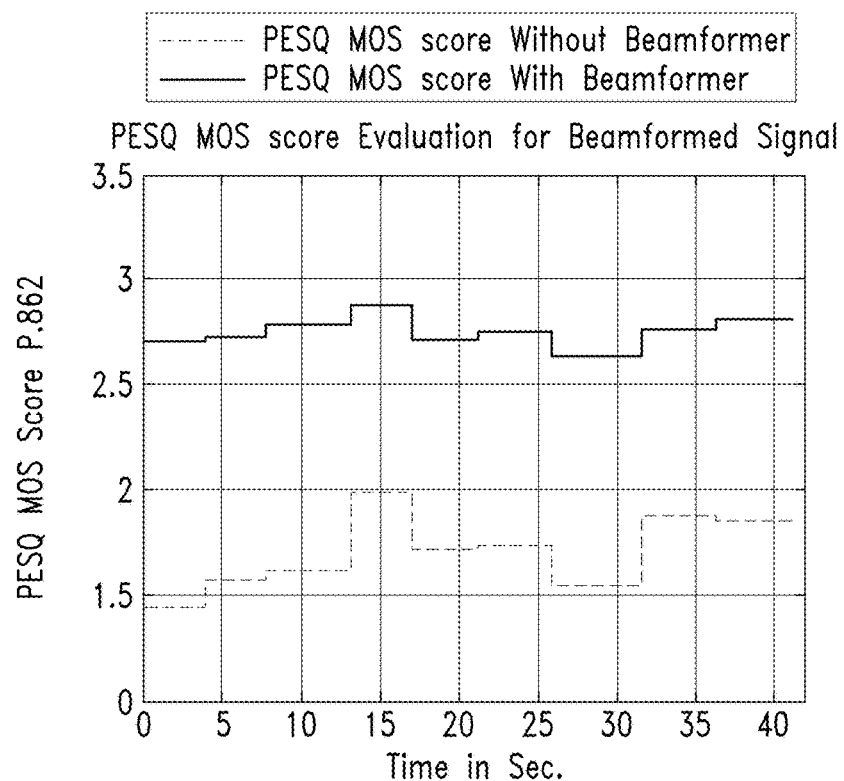

FIGS. 12A-12D show performance evaluation of the auto-directive adaptive wideband beamformer with and without orientation information. The source signal and the device are both experiencing orientation change. The source signal changes its orientation gradually as shown in FIG. 12B, whereas the orientation of the device 100 continuously changes between −20 degrees and 20 degrees in a sinusoidal pattern as shown in FIG. 12A. The PESQ MOS of the auto-directive beamformer with and without orientation information are shown in FIGS. 12C and 12D. The auto-directive beamformer with orientation information has a superior PESQ MOS.

Figure 13A:
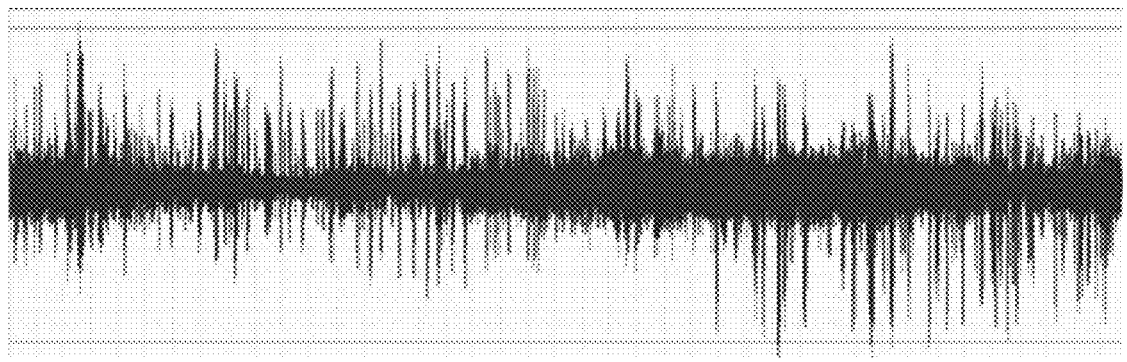
FIG. 13A shows a signal waveform received at a microphone array with an interference at an azimuth angle of 45 degrees and a speech source signal at the array broadside.
Figure 13B:
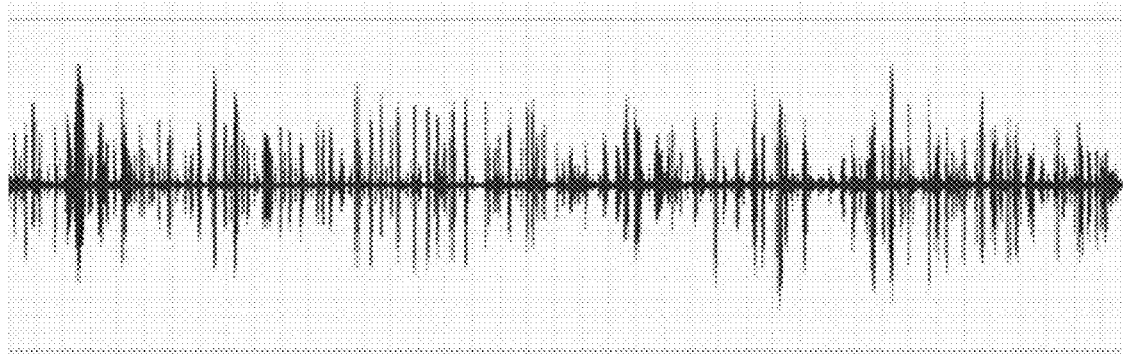
FIG. 13B shows the beamformer's output waveform for a speech source signal at the array broadside and an interference at an azimuth angle of 45 degrees.

FIG. 13A shows a signal waveform received at a microphone array with an interference at an azimuth angle of 45 degrees and a speech source signal at the array broadside. FIG. 13B shows the beamformer's output waveform for a speech source signal at the array broadside and an interference at an azimuth angle of 45 degrees. The interference noise source is car engine noise, whereas the source signal is speech. In FIGS. 13A and 13B, the array 104 is kept stationary. Due to the beamformer, interference noise is significantly attenuated.

Figure 14A:
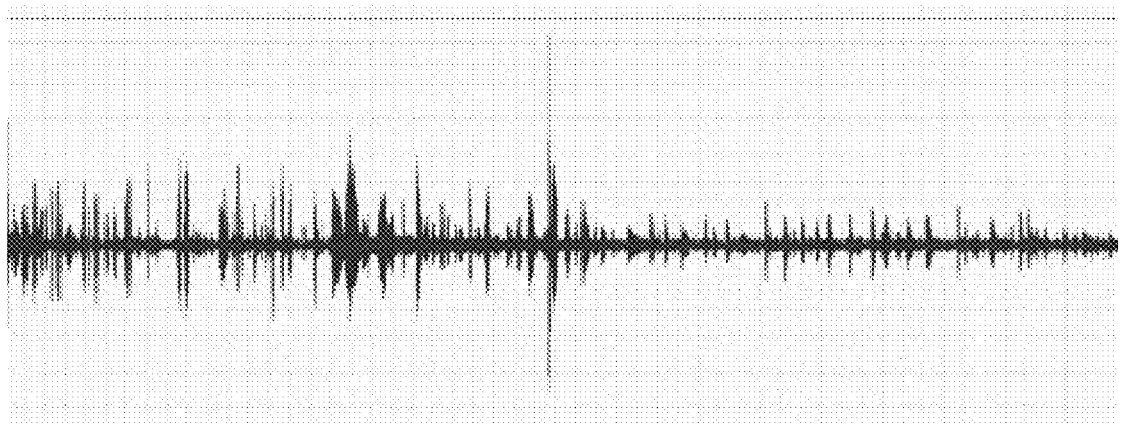
FIG. 14A shows an output waveform of a beamformer incorporating orientation information.
Figure 14B:
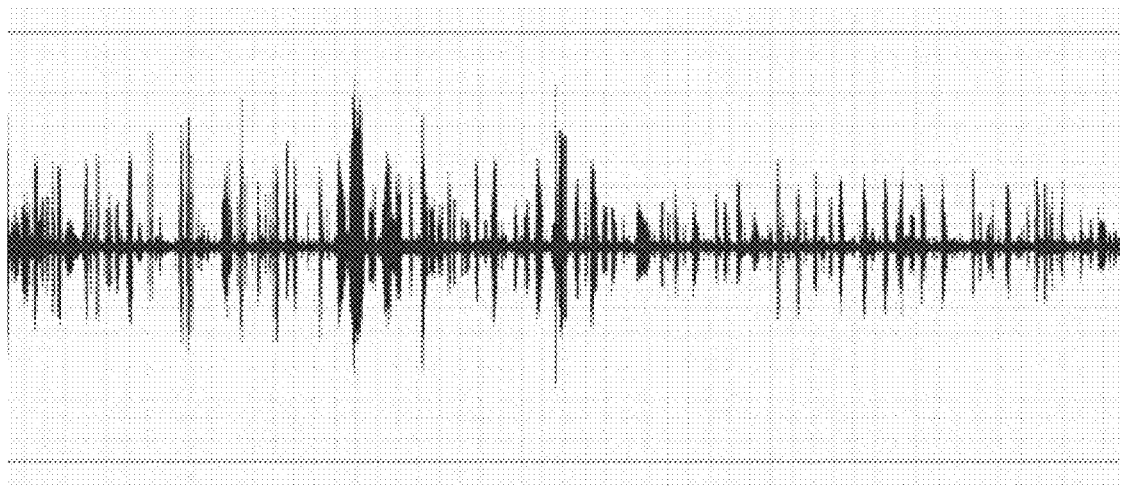
FIG. 14B shows an output waveform of a beamformer without orientation information.

FIG. 14A shows an output waveform of a beamformer incorporating orientation information. FIG. 14B shows an output waveform of a beamformer without orientation information. In FIGS. 14A and 14B, the interference noise source used is car engine noise, whereas the source signal is a speech signal. A stepper motor is used to rotate the microphone array in a controlled manner.

As described herein, an orientation change of the array is used to enhance the performance of the beamformer. The source signal is initially at the broadside of the microphone array 104 and the interference noise source is at 70 degrees. FIG. 14A shows a degraded beamformed output when the stepper motor changes the orientation of the array to 18 degrees in the azimuth plane for the first half of a recording and then to 36 degrees from the original orientation for the second half of the recording. Since the orientation of the desired source changes from the broadside due to array rotation, and the true azimuth is not derived automatically in this example, the performance of the beamformer degrades drastically with significant attenuation of the source signal. FIG. 14B shows the enhanced beamformer output waveform in which the source signal is not distorted when the orientation information of the microphone array is used as an additional input for pre-steering.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
 a microphone array including a plurality of microphones configured to capture audio and output one or more signals representative of the audio;
 a microelectromechanical systems (MEMS) sensor configured to detect an orientation of the microphone array and output data representative of the orientation;
 an audio decoder configured to receive the one or more signals, process the one or more signals and output data representative of the audio; and
 a processor configured to:
  receive the data representative of the audio and the data representative of the orientation, the data representative of the audio including a plurality of frames;
  estimate a direction of arrival of a source signal based on the data representative of the audio by:
   performing a short-time Fourier transform (STFT) on a frame of the plurality of frames to produce a transformed frame;
   determining whether the transformed frame has a signal power above a noise threshold; and
   in response to the signal power being above the noise threshold, estimating the direction of arrival of the source signal;
  detect, based on the data representative of the orientation, a change in the orientation of the microphone array;
  compensate the direction of arrival based on the change in the orientation of the microphone array;
  pre-steer a beam of a beam pattern of the microphone array based on the compensated direction of arrival to retain the source signal in a broadside of the microphone array; and
  perform adaptive wideband beamforming to null one or more interfering sources in the beam pattern while retaining the source signal in the broadside of the microphone array.

2. The device according to claim 1, wherein the processor is configured to:
 in response to the signal power being above the noise threshold, determine whether the frame has voice activity; and
 in response to the frame having the voice activity, estimate the direction of arrival of the source signal.

3. The device according to claim 2, wherein the processor is configured to:
 before determining whether the frame has the voice activity, perform a coherence test to determine whether the frame is dominated by a single source; and
 on a condition that the frame is dominated by the single source, determine whether the frame has the voice activity.

4. The device according to claim 1, wherein the MEMS sensor is an accelerometer, gyroscope, magnetometer, inertial sensor or magnetic compass.

5. The device according to claim 1, wherein the processor is configured to generate a histogram of a plurality of directions of arrival of the plurality of frames.

6. The device according to claim 5, wherein the processor is configured to determine a dominant source direction of arrival based on the histogram.

7. The device according to claim 6, wherein the processor is configured to determine the dominant source direction of arrival as a mean, median or mode of the histogram.

8. A system, comprising:
a processor; and
non-transitory computer-readable storage media having stored thereon executable instructions that, when executed by the processor cause the processor to:
receive data representative of audio captured by a microphone array including a plurality of microphones, the data representative of the audio including a plurality of frames;
receive data representative of an orientation of the microphone array detected by a microelectromechanical systems (MEMS) sensor;
estimate a direction of arrival of a source signal based on the data representative of the audio by:
performing a short-time Fourier transform (STFT) on a frame of the plurality of frames to produce a transformed frame;
determining whether the transformed frame has a signal power above a noise threshold; and
in response to the signal power being above the noise threshold, estimating the direction of arrival of the source signal;
detect, based on the data representative of the orientation, a change in the orientation of the microphone array;
compensate the direction of arrival based on the change in the orientation of the microphone array;
pre-steer a beam of a beam pattern of the microphone array based on the compensated direction of arrival to retain the source signal in a broadside of the microphone array; and
perform adaptive wideband beamforming to null one or more interfering sources in the beam pattern while retaining the source signal in the broadside of the microphone array.

9. The system according to claim 8, wherein the instructions cause the processor to estimate the direction of arrival of the source signal by:
in response the signal power being above the noise threshold, determining whether the frame has voice activity; and
in response to the frame having the voice activity, estimating the direction of arrival of the source signal.

10. The system according to claim 9, wherein the instructions cause the processor to:
before determining whether the frame has the voice activity, perform a coherence test to determine whether the frame is dominated by a single source; and
on a condition that the frame is dominated by the single source, determine whether the frame has the voice activity.

11. The system according to claim 8, wherein the MEMS sensor is an accelerometer, gyroscope, magnetometer, inertial sensor or magnetic compass.

12. The system according to claim 8, wherein the instructions cause the processor to generate a histogram of a plurality of directions of arrival of the plurality of frames.

13. The system according to claim 12, wherein the instructions cause the processor to determine a dominant source direction of arrival based on the histogram.

14. The system according to claim 13, wherein the instructions cause the processor to determine the dominant source direction of arrival as a mean, median or mode of the histogram.

15. A method, comprising:
receiving data representative of audio captured by a microphone array including a plurality of microphones, the data representative of the audio including a plurality of frames;
receiving data representative of an orientation of the microphone array detected by a microelectromechanical systems (MEMS) sensor;
estimating a direction of arrival of a source signal based on the data representative of the audio by:
performing a short-time Fourier transform (STFT) on a frame of the plurality of frames to produce a transformed frame;
determining whether the transformed frame has a signal power above a noise threshold; and
in response to the signal power being above the noise threshold, estimating the direction of arrival of the source signal;
detecting, based on the data representative of the orientation, a change in the orientation of the microphone array;
compensating the direction of arrival based on the change in the orientation of the microphone array;
pre-steering a beam of a beam pattern of the microphone array based on the compensated direction of arrival to retain the source signal in a broadside of the microphone array; and
performing adaptive wideband beamforming to null one or more interfering sources in the beam pattern while retaining the source signal in the broadside of the microphone array.

16. The method according to claim 15, wherein estimating the direction of arrival of the source signal includes:
in response to the signal power being above the noise threshold, determining whether the frame has voice activity; and
in response to the frame having the voice activity, estimating the direction of arrival of the source signal.

17. The method according to claim 16, comprising:
before determining whether the frame has the voice activity, performing a coherence test to determine whether the frame is dominated by a single source; and
on a condition that the frame is dominated by the single source, determining whether the frame has the voice activity.

* * * * *